(12) United States Patent
Kamiya

(10) Patent No.: US 9,608,232 B2
(45) Date of Patent: Mar. 28, 2017

(54) ORGANIC ELECTROLUMINESCENCE DISPLAY DEVICE

(71) Applicant: Japan Display Inc., Tokyo (JP)

(72) Inventor: Akinori Kamiya, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/181,592

(22) Filed: Jun. 14, 2016

(65) Prior Publication Data

US 2016/0285040 A1    Sep. 29, 2016

Related U.S. Application Data

(63) Continuation of application No. 14/559,960, filed on Dec. 4, 2014, now abandoned.

(30) Foreign Application Priority Data

Dec. 4, 2013    (JP) ................. 2013-251216

(51) Int. Cl.
*H01L 27/32*    (2006.01)
*H01L 51/52*    (2006.01)
*H01L 51/56*    (2006.01)

(52) U.S. Cl.
CPC ........ *H01L 51/5246* (2013.01); *H01L 27/322* (2013.01); *H01L 27/3276* (2013.01); *H01L 51/5253* (2013.01)

(58) Field of Classification Search
None
See application file for complete search history.

(56) References Cited

U.S. PATENT DOCUMENTS

2001/0054867 A1    12/2001  Kubota
2003/0127974 A1*    7/2003  Miyazawa .......... H01L 51/0003
                                                                              313/504

(Continued)

FOREIGN PATENT DOCUMENTS

JP    2001-284041 A    10/2001
JP    4303591 B    5/2009

(Continued)

OTHER PUBLICATIONS

Japanese Office Action mailed on Nov. 22, 2016, for corresponding Japanese Application No. 2013-251216.

*Primary Examiner* — Long K Tran
*Assistant Examiner* — Thai T Vuong
(74) *Attorney, Agent, or Firm* — Typha IP LLC

(57) ABSTRACT

The organic electroluminescence display device has a circuit board, an element layer which contains an organic electrode luminescence film and a positive electrode and a negative electrode sandwiching the organic electroluminescence film and which is formed on the circuit board, and a sealing film sealing the element layer. The sealing film contains an inorganic layer covering the element layer and an organic layer formed between a part of the element layer and a part of the inorganic layer. The upper surface of the element layer has an inorganic contact area contacting the inorganic layer and an organic contact area contacting the organic layer. The organic contact area is a hollow in the upper surface of the element layer. The area of the upper surface of the organic layer is smaller than the area of the lower surface contacting the inner surface of the hollow.

5 Claims, 2 Drawing Sheets

(56) References Cited

U.S. PATENT DOCUMENTS

| | | | |
|---|---|---|---|
| 2003/0146692 A1* | 8/2003 | Uchida | H01L 51/56 313/504 |
| 2007/0178224 A1* | 8/2007 | Fujii | H01L 27/3267 427/66 |
| 2010/0244005 A1* | 9/2010 | Gyoda | H01L 51/5237 257/40 |
| 2012/0228648 A1* | 9/2012 | Mitsuya | H01L 51/5044 257/88 |
| 2013/0119358 A1* | 5/2013 | Sasaki | H01L 51/5243 257/40 |
| 2013/0119387 A1* | 5/2013 | Park | H01L 51/5284 257/59 |
| 2013/0134452 A1* | 5/2013 | Okamoto | H01L 51/5209 257/88 |
| 2013/0161680 A1* | 6/2013 | Oh | H01L 51/5256 257/99 |
| 2013/0207084 A1* | 8/2013 | Im | H01L 27/3211 257/40 |
| 2013/0277659 A1* | 10/2013 | Sumida | H01L 51/5275 257/40 |
| 2013/0285103 A1 | 10/2013 | Kim et al. | |
| 2014/0014909 A1* | 1/2014 | Lee | H01L 51/5088 257/40 |

FOREIGN PATENT DOCUMENTS

| | | |
|---|---|---|
| JP | 2011-203397 A | 10/2011 |
| JP | 2012-94539 A | 5/2012 |
| WO | 03/028903 A2 | 4/2003 |

\* cited by examiner

ORGANIC ELECTROLUMINESCENCE DISPLAY DEVICE

CROSS-REFERENCE TO RELATED APPLICATION

This application is a continuation of U.S. patent application Ser. No. 14/559,960, filed on Dec. 4, 2014. Further, this application claims priority from Japanese application JP2013-251216 filed on December 4, the entire contents of which are hereby incorporated by reference into this application.

BACKGROUND OF THE INVENTION

1. Field of the Invention

The present invention relates to an organic electroluminescence display device.

2. Description of the Related Art

Organic electroluminescence display apparatuses require a sealed structure for isolating the organic. EL (Electro-Luminescence) film such as the light-emitting layer from the air. For example, a structure in which a multilayer sealing film containing an organic film of a resin sandwiched between inorganic films is used for sealing the organic EL films is known (Japanese Patent No. 4303591).

Although a high barrier property can be obtained with a structure in which the sealing film has an organic film, there has been a problem in that light is easily refracted at the boundary surface between the organic film and an inorganic film because the refractive indexes of these films are significantly different. In addition, when an organic film, which easily absorbs water, is continuously provided, there has been a problem in that water easily permeates and spreads.

SUMMARY OF THE INVENTION

An object of the invention is to provide a sealing film which maintains a high barrier property and in which the refraction of light and the spread of water can be prevented.

(1) The organic electroluminescence display device according to the invention is characterized by having: a circuit board; an element layer which contains an organic electroluminescence film and a positive electrode and a negative electrode sandwiching the organic electroluminescence film and which is formed on the circuit board; and a sealing film sealing the element layer: in which the sealing film contains an inorganic layer covering the element layer and an organic layer formed between a part of the element layer and a part of the inorganic layer; the upper surface of the element layer has an inorganic contact area contacting the inorganic layer and an organic contact area contacting the organic layer; the organic contact area is a hollow in the upper surface of the element layer; and the area of the upper surface of the organic layer is smaller than the area of the lower surface contacting the inner surface of the hollow. According to the invention, because the organic layer fills the hollow in the element layer, the inorganic layer can be formed on a surface with less unevenness and a high barrier property can be achieved. The refraction of light can be prevented in the inorganic contact area because there is no organic layer having a high refractive index, and the spread of water can be prevented because the organic layer is discontinuously provided.

(2) The organic electroluminescence display device of (1) may be characterized in that the positive electrode is two or more pixel electrodes under the organic electroluminescence film and the negative electrode is a common electrode on the organic electroluminescence film.

(3) The organic electroluminescence display device of (2) may be characterized in that the upper surface of the element layer has the inorganic contact area and the organic contact area in an area over each of the pixel electrodes.

(4) The organic electroluminescence display device, of (2) or (3) may be characterized by further having an insulating layer formed between an edge of each of the pixel electrodes and the common electrode, in which the upper surface of the element layer has a protruding part along the shape of the insulating layer, and the hollow is formed from a low area which is over each of the pixel electrodes and is adjacent to the protruding part to an area rising to form the protruding part.

(5) The organic electroluminescence display device of any one of (1) so (4) may be characterized in that the organic contact area is completely surrounded by the inorganic contact area.

DETAILED DESCRIPTION OF THE INVENTION

Figure 1:
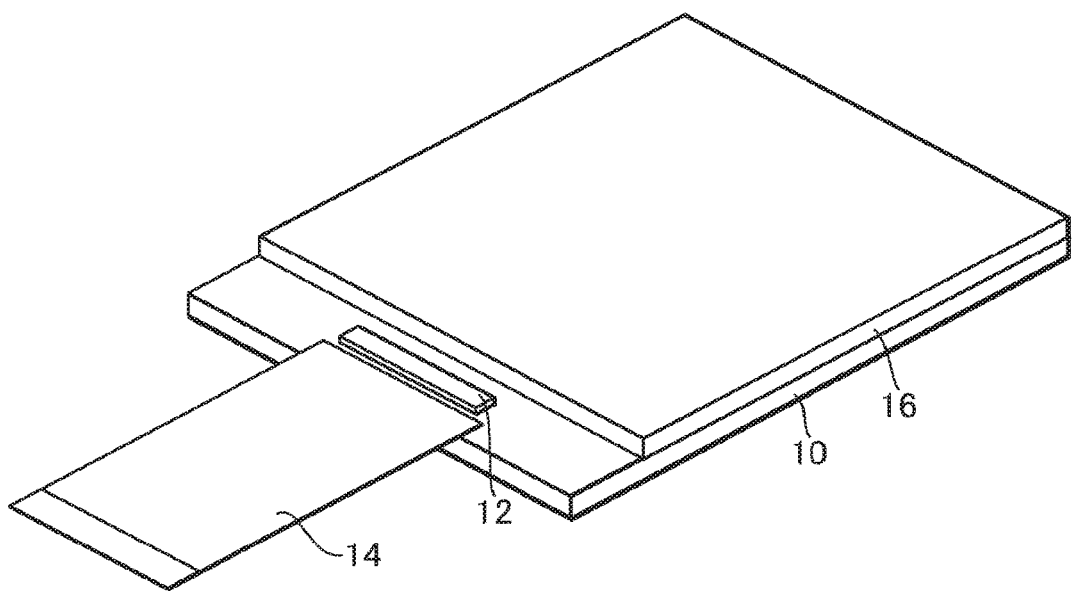
FIG. 1 is a perspective view of an embodiment of the organic electroluminescence display device according to the invention.

Embodiments of the invention are explained below referring to the drawings. FIG. 1 is a perspective view of an embodiment of the organic electroluminescence display device according to the invention.

As shown in FIG. 1, the organic electroluminescence display device has a circuit board 10. On the circuit board 10, an integrated circuit chip 12 for driving an element for displaying an image is provided. A flexible wiring substrate 14 is connected to the circuit board 10 for electrically connecting the circuit board 10 to an external device.

The display device has an opposite substrate 16. The opposite substrate 16 is provided in such a way that it faces the circuit board 10 at a distance. The opposite substrate 16 may be a color filter substrate. Although it is not shown in the drawings, the opposite substrate 16 is attached to the circuit board 10 with a fill agent filled in an area surrounded by a damming material.

Figure 2:
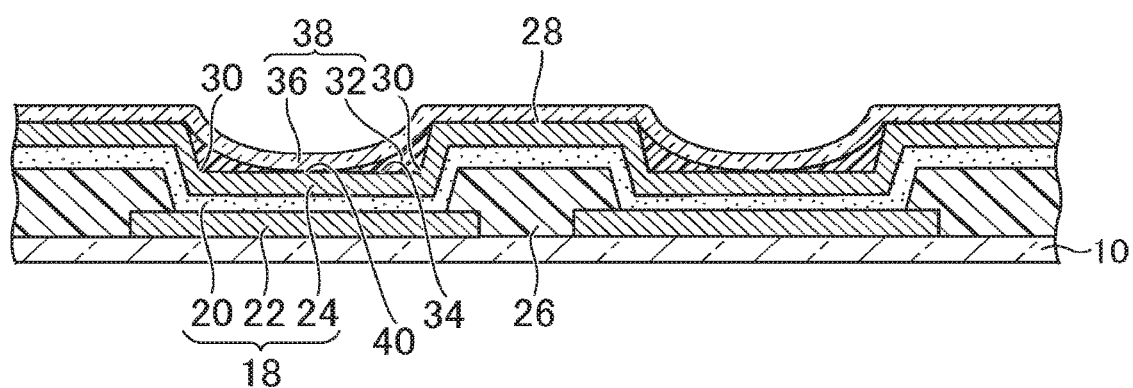
FIG. 2 is a cross-section showing an embodiment of the circuit board in detail.

FIG. 2 is a cross-section showing an embodiment of the circuit board 10 in detail. An element layer 18 is provided on the circuit board 10. The element, layer 18 contains an organic electroluminescence film 20. The organic electroluminescence film 20 contains a hole transport layer (not shown in the drawings).

The hole transport layer can be formed using metal phthalocyanine such as copper phthalocyanine and copper tetra(t-butyl) phthalocyanine, metal-free phthalocyanine, a quinacridone compound, an aromatic amine low-molecular hole injection transport material such as 1,1-bis(4-di-p-tolylaminophenyl)cyclohexane, N,N'-diphenyl-N,N'-bis(3-methylphenyl)-1,1'-biphenyl-4,4'-diamine and N,N'-di(1-naphthyl)-N,N'-diphenyl-1,1-biphenyl-4,4'-diamine, a high-molecular hole transport material such as poly(para-phenylene vinylene) and polyaniline, a polythiophene oligomer material, or other known hole transport materials.

After forming the hole transport layer, an organic light-emitting layer (not, shown in the drawings) is formed. The organic light-emitting layer is a layer that emits light when electric current flows, and the organic light-emitting material forming the organic light-emitting layer may be a material that is generally used as an organic light-emitting material. Examples thereof are known fluorescent low-molecular materials capable of emitting light from the singlet state such as materials of coumarin, perylene, pyran, anthrone, porphyrin, quinacridone, N,N'-dialkyl-substituted quinacridone, naphthalimide and N,N'-diaryl-substituted pyrrolopyrrole, and known phosphorescent low-molecular materials capable of emitting light from the triplet state such as rare-earth metal complexes.

After forming the organic light-emitting layer, an electron transport layer (not shown in the drawings) is formed. The material of the electron transport layer may be a material that is generally used as an electron transport material. Examples thereof are low-molecular materials of triazole, oxazole, oxadiazole, silole, boron and the like, and the electron transport layer can be formed by a vacuum vapor deposition method.

As the method for forming the hole transport layer, the organic light-emitting layer and the electron transport layer, a vacuum vapor deposition method s used for a deposition-type material, and a known film formation method such as a nozzle printing method, a spin coating method, a slit coating method, an ink jet method or a letterpress printing method can be used for a coating-type material.

The element layer 18 contains two or more pixel electrodes 22 (positive electrodes). As the material of the pixel electrodes 22, a transparent electrode material such as ITO (a composite oxide of indium and tin), IZO (a composite oxide of indium and zinc), tin oxide, zinc oxide, indium oxide and a composite oxide of aluminum oxide can be used. In this regard, ITO (indium tin oxide) is preferable because of its low resistance, resistance to solvents, transparency or the like. The pixel electrodes 22 are formed by film-forming of ITO by a sputtering method.

The element layer 18 also contains a common electrode 24 (negative electrode). As the material, of the common electrode 24, for example, a transparent electrode material such as ITO, IZO, tin, oxide, zinc oxide, indium oxide and a composite oxide of aluminum oxide, or the like can be also used, though the material is not limited to these examples. An example of the method for forming the common electrode 24 (negative electrode) is a formation method by a sputtering method.

In this regard, the present embodiment has a constitution in which the hole transport layer, the organic light-emitting layer and she electron transport layer have been laminated between the pixel electrodes 22, which are positive electrodes, and the common electrode 24, which is a negative electrode, from the side of the pixel electrodes 22. It is possible to apply a laminate structure in which layers such as a hole blocking layer and an electron injection layer selected it necessary have been laminated in addition to the hole transport layer and the organic light-emitting layer between the pixel electrodes 22 and the common electrode 24. Furthermore, the same formation methods as for the hole transport layer, the organic light-emitting layer and the negative electrode layer can be used for forming these layers.

The organic electroluminescence film 20 is sandwiched between the pixel electrodes 22 (positive electrodes) and the common electrode 24 (negative electrode). The pixel electrodes 22 are under the organic electroluminescence film 20. The common electrode 24 is on the organic electroluminescence film 20.

An insulating layer 26 is between an edge of each of the pixel electrodes 22 and the common electrode 24. The contact (short circuit) of the pixel electrodes 22 and the common electrode 24 can be prevented by the insulating layer 26. The insulating layer 26 is formed using a photo-sensitive material by a photolithography method. Specifically, a photosensitive resin composition is coated on the circuit board 10 and a partitioned pattern is formed by pattern-exposure and development. The insulating layer 26 is formed using a resin composition in such a way that the light-emitting area corresponding to each pixel is divided, and the insulating layer 26 is formed to cover an edge of one of the pixel electrodes 22 for example.

The upper surface of the element layer 18 has a protruding part 28 along the shape of the insulating layer 26. A hollow 30 is formed in the upper surface of the element layer 18 from a low area which is over each of the pixel electrodes 22 and is adjacent to the protruding part 28 to an area rising to form the protruding part 28.

An organic layer 32 is provided in the hollow 30. The organic layer 32 is formed from an acrylic resin, polyethylene terephthalate or the like and can be formed by optional appropriate processes including a vacuum process such as vapor deposition, sublimation and a combination thereof and a coating process such as a nozzle printing method, a spin coating method, a slit coating method, an ink-jet method, a letterpress printing method, an intaglio offset printing method and a letterpress reverse offset printing method. The organic layer 32 is polymerized by applying UV after the film formation.

The upper surface of the element layer 18 has an organic contact area 34 contacting the organic layer 32. The organic contact area 34 is in an area over each of the pixel electrodes 22. The organic contact area 34 is the hollow 30 in the upper surface of the element layer 18. The area of the upper surface of the organic layer 32 is smaller than the area of the lower surface contacting the inner surface of the hollow 30.

An inorganic layer 36 is formed on the organic layer 32. For example, an SiN, SiO or SiON film is formed by a plasma CVD method. In case of SiN, an SiN film is formed by generating plasma in a mixed gas of $SiH_4$, $NH_3$ and $N_2$ during the film formation. The thickness of the SiN film is 400 nm and the film formation is conducted at a substrate temperature of 100° C. or lower.

The inorganic layer 36 can be formed by optional appropriate processes including conventional vacuum processes such as sputtering, vapor deposition, sublimation, CVD (chemical vapor deposition), PECVD (plasma-enhanced chemical vapor deposition), ECR-PECVD (electron cyclotron resonance plasma-enhanced chemical vapor deposition) and a combination thereof.

A sealing film 38 sealing the element layer 18 is constituted by the inorganic layer 36 and the organic layer 32. The sealing film 38 contains the organic layer 32. The organic layer 32 is between a part or the element layer 18 and a part of the inorganic layer 36. The organic contact area 34 is completely surrounded by an inorganic contact area 40. The sealing film 38 also contains the inorganic layer 36. The inorganic layer 36 is formed to cover the element layer 18. The upper surface of the element layer 18 has the inorganic contact area 40 contacting the inorganic layer 36. The inorganic contact area 40 is in an area over each of the pixel electrodes 22.

By thus forming the sealing film 38 by a two-layer structure unlike the conventional three-layer structure, it is possible to shorten the time and cut the cost for the sealing step and the subsequent step for exposing terminals.

According to the embodiment, because the organic layer 32 fills the hollow 30 in the element layer 18, the inorganic layer 36 can be formed on a surface with less unevenness and a high barrier property can be achieved. The refraction of light can be prevented in the inorganic contact area 40 because there is no organic layer 32 having a high refractive index, and the spread of water can be prevented because the organic layer 32 is discontinuously provided.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic electroluminescence display device comprising:
    a circuit board;
    an element layer which contains an organic electroluminescence film and a positive electrode and a negative electrode sandwiching the organic electroluminescence film and which is formed on the circuit board;
    a partition wall partitioning the element layer into pieces for pixels; and
    a sealing film sealing the element layer,
    wherein one of the positive electrode and negative electrode is a common electrode on a top surface of the element layer,
    the common electrode lies over the partition wall, whereby having an upper surfaces along the partition walls, the upper surfaces including a first flat surface over the partition wall, a second surface being closer to the circuit board than the first surface, and an inclined surface between the first surface and the second surface,
    the sealing film contains an inorganic layer covering the element layer and contains an organic layer formed between a part of the common electrode and a part of the inorganic layer;
    the organic layer sits on a position between the second flat surface and the inclined surface and in contact with the common electrode,
    the upper surfaces of the common electrode have an inorganic contact area contacting the inorganic layer and have an organic contact area contacting the organic layer around the position between the second flat surface and the inclined surface; and
    the organic layer has an upper surface which is smaller than a lower surface thereof, the lower surface contacting the common electrode around the position between the second flat surface and the inclined surface.

2. The organic electroluminescence display device of claim 1,
    wherein the positive electrode is two or more pixel electrodes under the organic electroluminescence film and the negative electrode is the common electrode on the organic electroluminescence film.

3. The organic electroluminescence display device of claim 2,
    wherein the upper surfaces of the common electrode have the inorganic contact area and the organic contact area in an area over each of the pixel electrodes.

4. The organic electroluminescence display device of claim 2
    wherein the partition wall is an insulating layer sitting between an edge of each of the pixel electrodes and the common electrode,
    wherein the upper surfaces of the common electrode have a protruding part along a shape of the insulating layer, whereby relatively having a hollow from the second flat surface, which is lower than the protruding part over each of the pixel electrodes and is adjacent to the protruding part, to a rising area of the protruding part.

5. The organic electroluminescence display device of claim 1,
    wherein the organic contact area is completely surrounded by the inorganic contact area.

* * * * *